United States Patent [19]

Winnerl et al.

[11] Patent Number: 5,100,811
[45] Date of Patent: Mar. 31, 1992

[54] INTEGRATED CIRCUIT CONTAINING BI-POLAR AND COMPLEMENTARY MOS TRANSISTORS ON A COMMON SUBSTRATE AND METHOD FOR THE MANUFACTURE THEREOF

[75] Inventors: Josef Winnerl, Landshut; Franz Neppl, Munich, both of Fed. Rep. of Germany

[73] Assignee: Siemens Aktiengesellschaft, Munich, Fed. Rep. of Germany

[21] Appl. No.: 632,411

[22] Filed: Dec. 21, 1990

Related U.S. Application Data

[63] Continuation-in-part of Ser. No. 61,303, Jun. 12, 1987, abandoned.

[30] Foreign Application Priority Data

Jul. 4, 1986 [DE] Fed. Rep. of Germany ....... 3622525

[51] Int. Cl.$^5$ .................. H01L 21/265; H01L 29/70
[52] U.S. Cl. ........................ 437/31; 437/59; 357/43
[58] Field of Search .............. 357/23.9, 71, 34, 67; 437/31, 59

[56] References Cited

U.S. PATENT DOCUMENTS

| | | | |
|---|---|---|---|
| 4,510,670 | 4/1985 | Schwabe | 437/200 |
| 4,521,952 | 6/1985 | Riseman | 357/67 |
| 4,529,456 | 7/1985 | Anzai et al. | 357/34 |
| 4,554,572 | 11/1985 | Chaterjee | 357/71 |
| 4,586,968 | 5/1986 | Coello-Vera | 357/71 |
| 4,714,951 | 12/1987 | Baudrant et al. | 357/23.9 |
| 4,764,482 | 8/1988 | Hsu | 437/59 |
| 4,855,245 | 8/1989 | Neppl et al. | 437/31 |
| 4,927,776 | 5/1990 | Soejima | 437/31 |

OTHER PUBLICATIONS

Murarka et al., "Refractory Silicides of Titanium and Tantalum for Low-Resistivity Gates and Interconnects"-IEEE Transactions on Electron Devices, vol. E27, Aug. 1980 pp. 1409-1417.

"Method to Reduce Mechanical Stress within the Emitter of Bipolar Transistors"-IBM Technical Disclosure Bulletin-vol. 28, No.4, Sep. 1985 p. 1442.

Primary Examiner—Olik Chaudhuri
Assistant Examiner—Long Pham
Attorney, Agent, or Firm—Hill, Van Santen, Steadman & Simpson

[57] ABSTRACT

An integrated circuit containing bipolar and complementary MOS transistors wherein the base and emitter terminals of the bipolar transistor, as well as the gate electrodes of the MOS transistors, are composed of a silicide or of a double layer polysilicon silicide. The base and emitter terminals, as well as the gate electrodes, are arranged in one level of the circuit and there p$^+$ doping or, respectively, n$^+$ doping proceeds by ion implantation in the manufacture of the source/drain zones of the MOS transistors. As a result of the alignment independent spacing between the emitter and the base contact, the base series resistance is kept low and a reduction of the space requirement is achieved. Smaller emitter widths are possible by employing the polycide or silicide as diffusion source and as the terminal for the emitter. The size of the bipolar transistor is not limited by the metallization grid, since the silicide terminals can be contacted via the field oxide. The integrated semiconductor circuit is employed in VLSI circuits having high switching speeds.

19 Claims, 6 Drawing Sheets

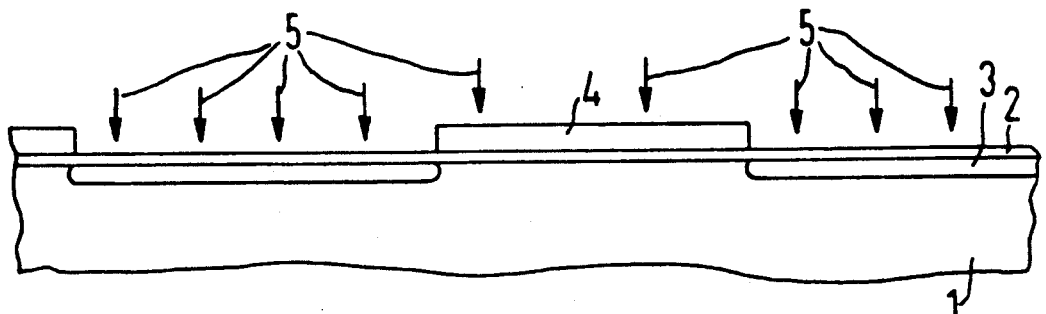
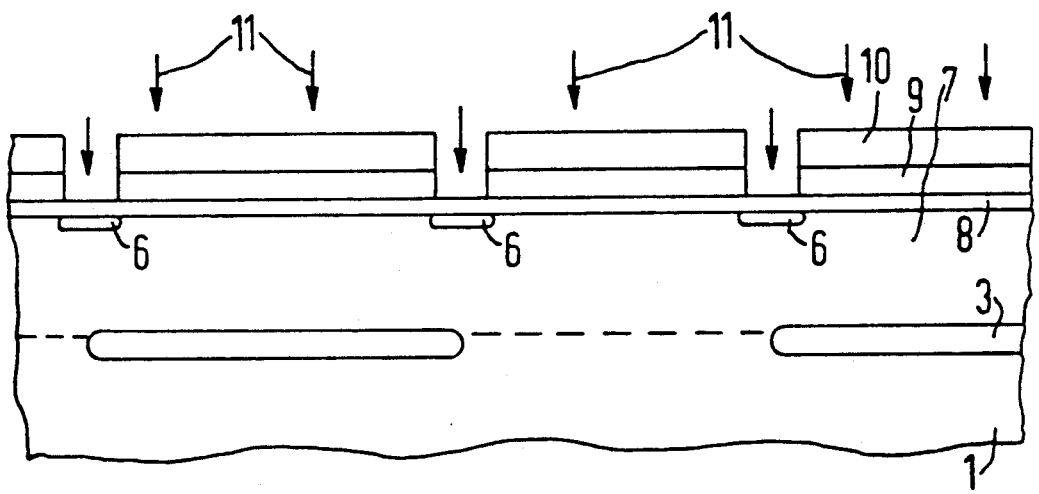
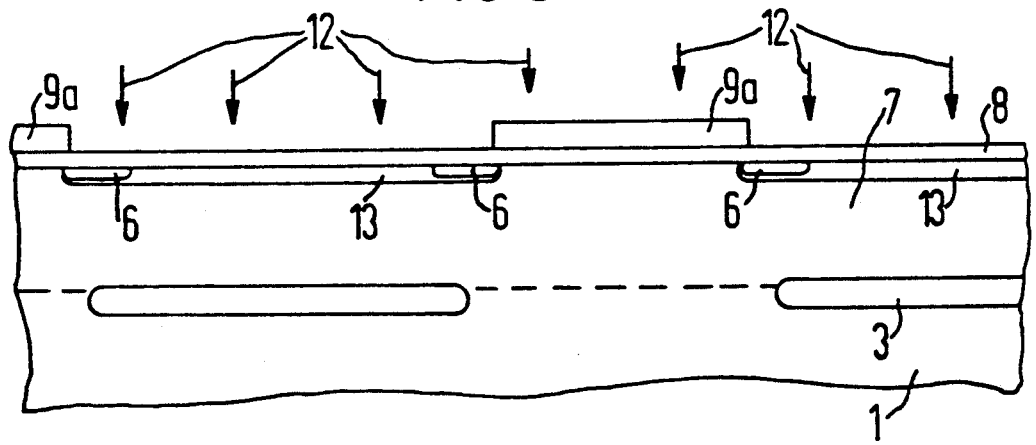

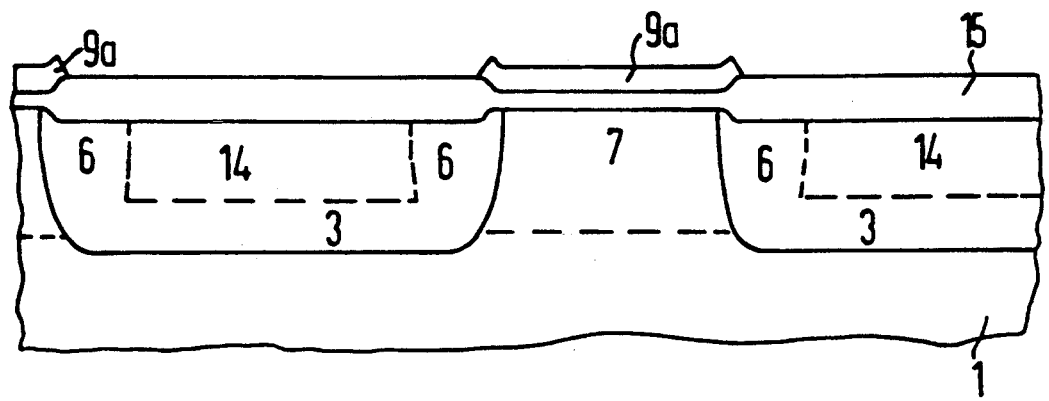
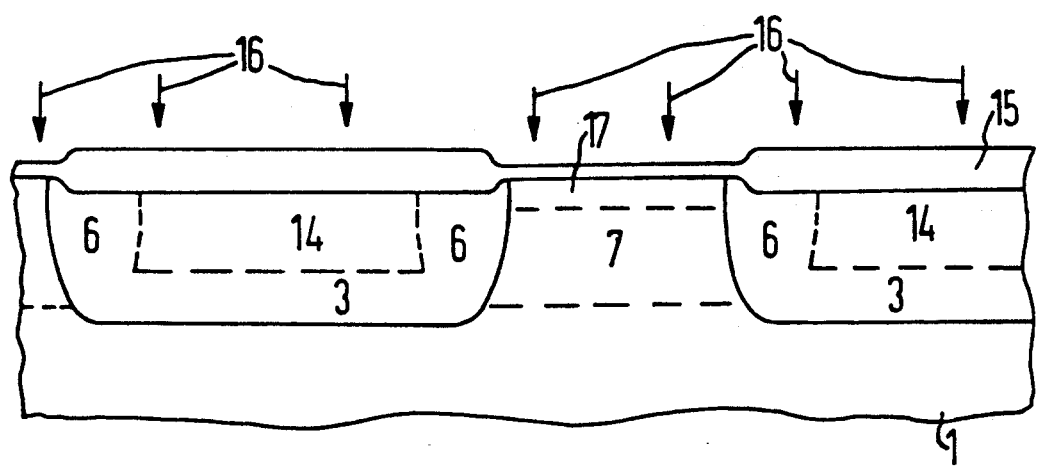
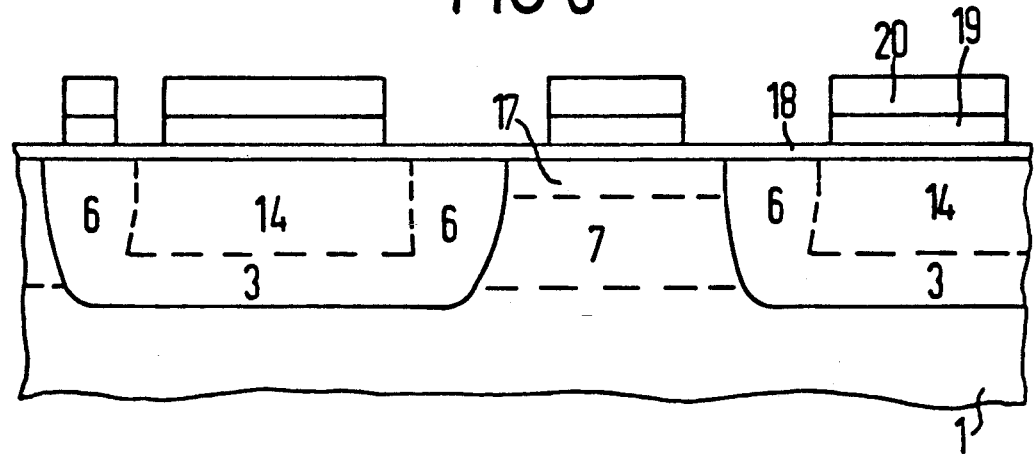

INTEGRATED CIRCUIT CONTAINING BI-POLAR AND COMPLEMENTARY MOS TRANSISTORS ON A COMMON SUBSTRATE AND METHOD FOR THE MANUFACTURE THEREOF

This is a continuation, division, of application Ser. No. 061,303, filed June 12, 1987 now abandoned.

BACKGROUND OF THE INVENTION

The present invention relates to an integrated circuit containing bipolar and complementary MOS transistors on a common substrate wherein the emitter and base terminals of the bipolar transistors, as well as the gate electrodes of the MOS transistors, are at least partially composed of a doped silicide of a refractory metal. The invention also relates to a method for the manufacture of such integrated circuits.

An integrated circuit containing bipolar and complementary MOS transistors on a common substrate wherein the emitter terminals of the bipolar transistors as well as the gate electrodes of the MOS transistors are composed of the same material including at least one layer of a refractory metal silicide of a metal such as tantalum tungsten, molybdenum titanium or platinum is disclosed in U.S. patent application, Ser. No. 897,299, now abandoned. Utilizing such a silicide eliminates the implantation mask used in traditional methods and the contacting of base, emitter, and collector regions becomes independent of the metallization grid. U.S. Pat. No. 4,782,033 discloses a method for producing p-channel and n-channel MOS transistors comprising gate electrodes composed of a doped double layer of polysilicon and metal silicide.

In the integrated circuits disclosed in U.S. patent application, Ser. No. 897,299, now abandoned, the n-well forms the collector of the transistor and covers the n+-doped zones that are connected in the bipolar transistor region by more deeply extending collector terminals. The advantages of the silicide or, respectively, polycide (a double layer of polysilicon and metal silicide) are thereby combined with the advantages of a deep extending collector terminal, e.g., reducing the collector series resistance and increasing the latch-up stability.

The method of the present invention provides an improvement over U.S. patent application Ser. No. 897,299 (now abandoned) in that through the method of the present invention, the base and emitter contact are formed in the same layer and, therefore, the spacing between the emitter and base contact can be further reduced and series resistances are diminished as a result thereof.

SUMMARY OF THE INVENTION

Pursuant to the present invention, an integrated circuit is created that contains CMOS transistors and bipolar transistors on one chip. Because of the utilization of polycide and silicide as a diffusion source and as a terminal for the emitter, the present invention provides for smaller emitter widths and thus allows a further increase in packing density.

The present invention provides an integrated circuit as set forth above, wherein the emitter and the base contact, as well as the gate electrodes, are arranged in one layer of the circuit and their p+ or, respectively n+, doping ensues by ion implantation and diffusion in the manufacture of the source/drain zones of the MOS transistors. The emitter and base contact, as well as, the gate electrodes can be comprised of a double layer of polysilicon and tantalum silicide and comprise side wall insulated layers (spacer oxides).

The present invention also provides a method that allows for the manufacture of the integrated circuit in optimally simple, mask-saving process steps whereby n-channel and p-channel MOS transistors can be produced with corresponding n+ or p+ doped polysilicon gates, because of the modified doping ratios, the short channel properties are improved.

The method for creating the integrated circuits comprises the following steps:

a) producing a buried n+ doped zone in the p-zone substrate through the implantation of n-doping ions following prior masking of the remaining regions;

b) applying surface-wide a p-doped epitaxial layer;

c) providing surface-wide a double insulating layer of silicon oxide and silicon nitride;

d) structuring the silicon nitride layer by photolithography to define the areas for the deep extending collector contacts and implanting n-doping ions in those areas;

e) removing the silicon nitride structures in those areas of the substrate where the n-wells are to be formed, and generating the n-wells in the substrate by implanting n-doping ions in those areas;

f) diffusing the n-doping ions to form the n-wells while simultaneously oxidizing the surface of the n-well areas;

g) implanting boron ions for the manufacture of the surface-distal region of the channel zone of the n-transistors after the removal of the silicon nitride structures, whereby the oxide acts as a mask;

h) applying a double layer composed of silicon oxide and silicon nitride and structuring of the silicon nitride layer for the following local oxidation (LOCOS);

i) implanting boron ions for doping the field oxide regions of the n-channel transistors following prior photoresist masking of the remaining regions;

j) manufacturing the field oxide required for the separation of the transistor regions in the substrate, by locally oxidizing the field oxide regions utilizing the silicon nitride structure as an oxidation mask;

k) producing the gate oxide by surface-wide oxidation after removal of the silicon nitride structure;

l) executing a surface-wide flat boron ion implantation for doping the channel regions of the n-channel and p-channel MOS transistor;

m) manufacturing the base zone in the bipolar transistor region by boron implantation following prior photoresist masking of the remaining regions;

n) removing the gate oxide in the region of the base zone;

o) depositing surface-wide a single layer of a metal silicide or a double layer of polysilicon and metal silicide;

p) structuring the metal silicide layer, or the polysilicide double layer, for the manufacture of the gate electrodes of the MOS transistors, as well as the base and emitter terminals of the bipolar transistors;

q) generating a side wall insulating layer (spacer oxide) by surface-wide oxide deposition from the vapor phase and anisotropic etching;

r) simultaneously forming: the source/drain regions of the n-channel transistors, the n-doping of the collector and emitter contacts of the bipolar transistors, and the gate electrodes of the n-channel transistors by phosphorus ion implantation following prior photoresist masking of the p-channel transistor regions and of the bipolar transistor regions with the exception of the n-emitter region and the collector contact regions;

s) simultaneously forming: the source/drain regions of the p-channel transistors, the p-doping of the base contact of the bipolar transistors, and the gate electrode of the p-channel transistors by boron ion implantation following photoresist masking of the n-channel transistor regions and of the bipolar transistor regions with the exception of the p-base region;

t) implementing a high-temperature treatment for the diffusion of the base and emitter contacts;

u) depositing a surface-wide silicon oxide layer acting as an intermediate oxide from the vapor phase; and v) completion of the circuit arrangement proceeds in a known manner by means of contact hole techniques, metallization for the manufacture of the terminal electrodes and passivation.

In an embodiment of the invention, the method also comprises the structuring of the gate by local oxidation of polysilicon and subsequent oxide etching so that an oxide spacer is created at the gates and the critical etching process of polysilicon to silicon in the region of the bipolar transistors for the separation of the base and the emitter contact is eliminated.

BRIEF DESCRIPTION OF THE DRAWINGS

FIGS. 1-12 illustrate an embodiment of a method for making the integrated circuit of the present invention.

DETAILED DESCRIPTION OF THE PRESENTLY PREFERRED EMBODIMENTS

Figure 7:
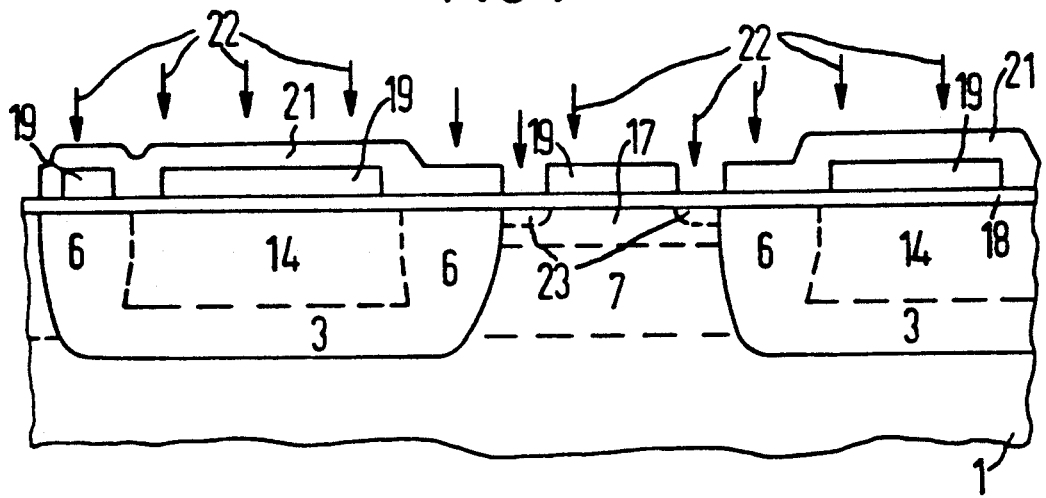

The present invention shall now be described with reference to FIGS. 1-17 wherein identical reference characters have been employed for identical parts.

Referring now to FIG. 1, pursuant to the method of the present invention, the buried collector area 3 is first generated on a monocrystalline, p-doped, (100)-oriented silicon wafer 1 having a specific electrical resistance of 20 ohm.cm and a silicon dioxide layer. The buried collector area 3 is produced with the aid of a photoresist mask 4, using an antimony or arsenic ion implantation 5, having a dose level of $3 \times 10^{15}$ cm$^{-2}$ and an energy level of 80 keV.

Referring now to FIG. 2, the areas for the deep collector contacts 6 are manufactured. To this end, a 3 micron thick, p-doped epitaxial layer 7, having a specific electrical resistance of 20 ohms.cm, is deposited on the structure illustrated in FIG. 1. After removal of the silicon dioxide layer 2, the epitaxial layer 7 is covered with a double insulating layer composed of a 50 nm thick silicon dioxide layer 8 and of a 140 nm thick chemically vapor deposited silicon nitride layer 9. The silicon nitride layer 9 is structured by a photoresist technique 10 and, subsequently, the collector deep implantation 11 is carried out with phosphorus ions through a dose of $3 \times 10^{15}$ cm$^{-2}$ and at an energy level of 80 keV.

The n-well areas, illustrated as 14 in FIG. 4, are generated, as illustrated in FIG. 3, by means of a phosphorous ion implantation 12 having a dose level of $2 \times 10^{12}$ cm$^{-2}$ and an energy level of 180 keV following prior photoresist technique (not shown) and removal of the nitride structure over the n-well regions 14. The nitride structure 9a remains and the implanted regions 13 are created.

Referring now to FIG. 4, the oxidation for masking the n-well areas 14 now proceeds, as does, simultaneously, the drive-in of the phosphorus ions, i.e., the generation of the n-well 14 and collector contact 6. A silicon dioxide layer 15 is created on the surface, whereby the nitride structure 9a serves as a mask. A temperature treatment of approximately 1150° C. is utilized so that the collector terminal 6 is driven about 3 um into the substrate 1 ensuring that the buried collector area 3 is reached.

Referring now to FIG. 5, after removal of the silicon nitride structure 9a, the first deep implantation of the double channel implantation of the n-channel transistor is produced by means of a surface-wide deep implantation 16 with boron ions using a dose level of $8 \times 10^{11}$ cm$^{-2}$ and an energy level of 60 keV. The silicon dioxide layer 15 serves as a mask. The p-doped region 17 under the channel is thereby created.

FIG. 6 illustrates the next step in the method. The creation of a double layer 18 and 19, composed of thermally grown silicon dioxide to a thickness of about 50 nm over which there is deposited a 140 nm layer of silicon nitride. The structuring of the silicon nitride layer 19 occurs through the use of a photoresist mask 20 of the subsequently occuring local oxidation (LOCOS).

The next step of the process, is the generation of the field doping in the n-channel area. As illustrated in FIG. 7, the field doping in the n-channel area is generated using a boron implantation 22 having a dose level of $1.2 \times 10^{13}$ cm$^{-2}$ and an energy level of 25 keV, using a photoresist process which utilizes a mask 21. The p-doped areas 23 are thereby created.

Figure 8:
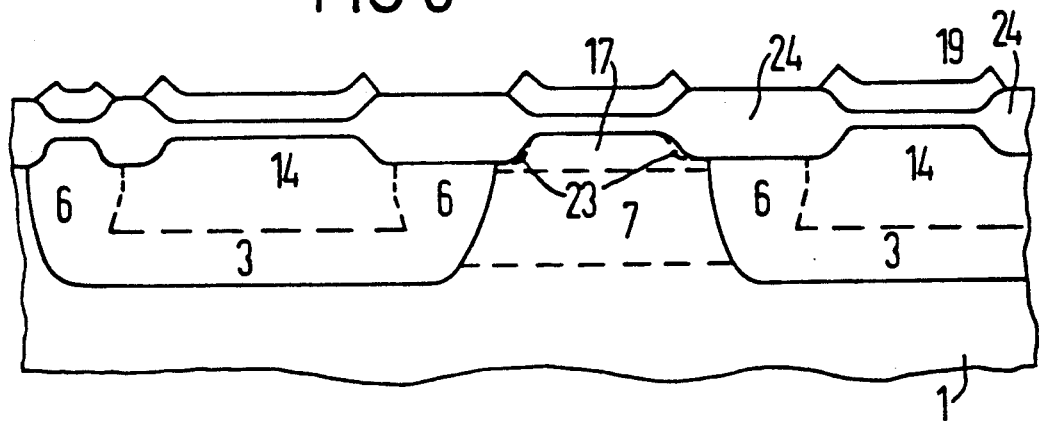

The field oxide for separating the active transistor areas is now generated. As illustrated in FIG. 8, the field oxide 24 is generated by local oxidation by employment of the silicon nitride structure 19 as a mask. The oxide layer has a thickness of about 850 nm. The oxide layers are identified as 24 in the Figures.

Figure 9:
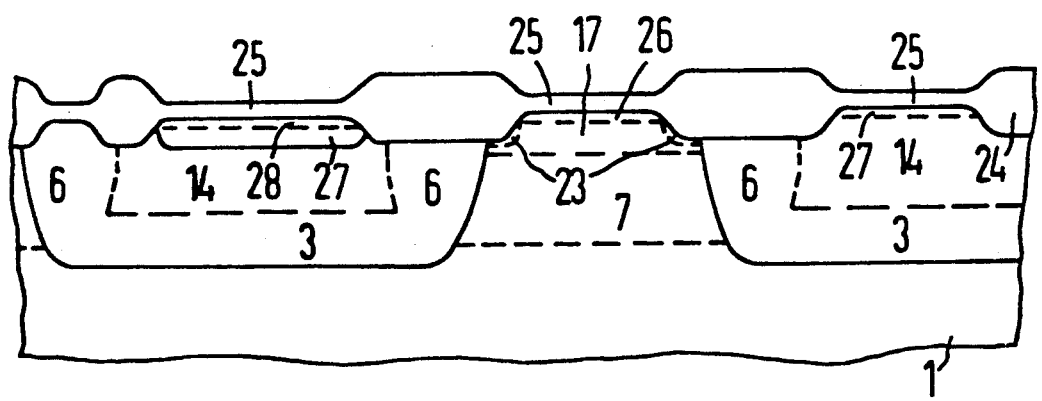

As illustrated in FIG. 9, after removal of the silicon nitride structure 19, the gate oxidation proceeds with a layer thickness of 25 nm for the gate oxide 25. When polycide is utilized as the material for the emitter terminal and gate material, it is preferable to carry out a deep and a flat channel implantation with boron ions at this location to increase channel doping. The flat implantation is executed surface-wide with a dose level of $2 \times 10^{11}$ cm$^{-2}$ and an energy level of 25 keV and the deep implantation is carried out with a phototechnique only in the n-channel area of the MOS transistors with a dose level of $8 \times 10^{11}$ cm$^{-2}$ and an energy level of 60 keV. The channel regions 26 and 27 and the p-region 28 in the base of the bipolar transistor are thereby created.

Figure 10:
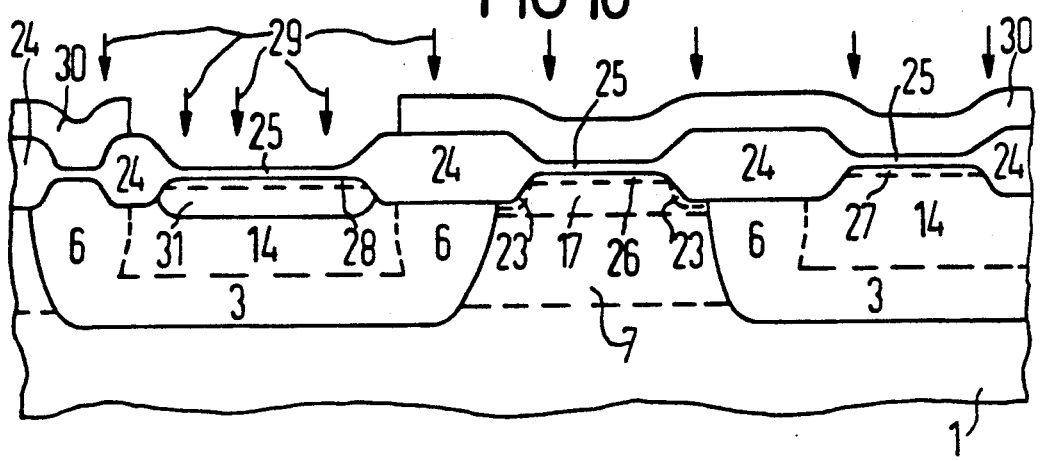

As illustrated in FIG. 10, the base implantation 29 of the bipolar transistor is now formed after application of a photoresist mask 30, using boron ions having a dose level of $9 \times 10^{13}$ cm$^{-2}$ and an energy level of 80 keV. The p-doped base zone 31 is thus created. The gate oxide layer 25 is removed in the area of the base zone 28 and 31.

The process steps described thus far are substantially identical to the process steps of the U.S. patent application, Ser. No. 897,299 (now abandoned), illustrated in FIGS. 1-10 thereof.

Figure 11:
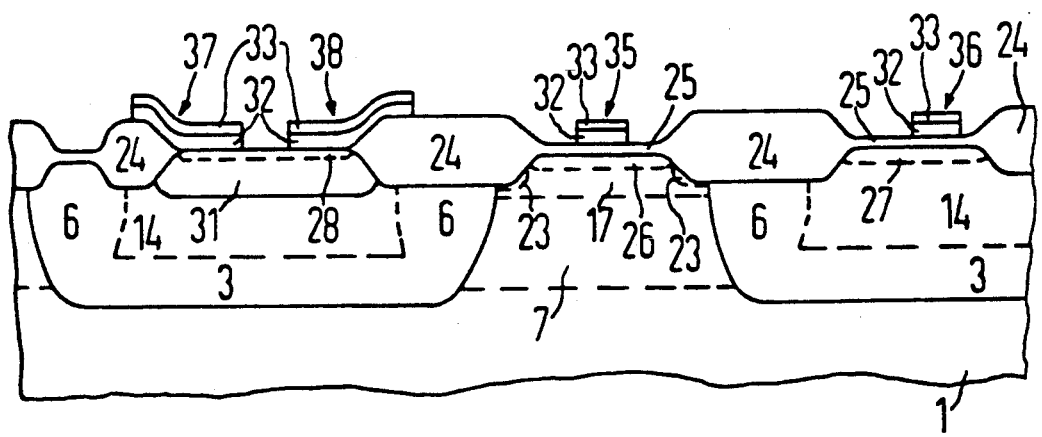

Referring now to FIG. 11, the gate electrodes of the MOS transistors B, C (35, 36) as well as the base contact 37 and emitter contact 38 of the bipolar transistor A, are produced. To this end, after removal of the photoresist mask 30, a surface-wide deposition of a double layer of a polysilicon layer 32 and of a tantalum silicide layer 33 is carried out and, subsequently, the gate electrodes 35 and 36 and the base and emitter contacts 37 and 38, respectively, are structured by means of a photoresist mask (not shown). A single tantalum silicide layer 33 can also be employed instead of a double layer 32 and 33.

Figure 12:
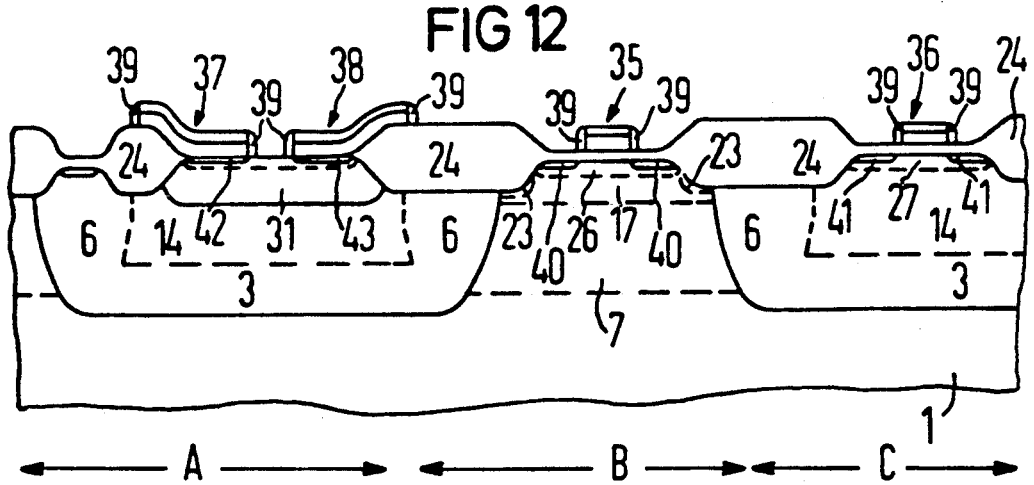

Referring now to FIG. 12, through surface-wide oxide deposition, for example by thermal decomposition of tetraethylorthosilicate and a etching step, the side wall insulating layers 39 (spacer oxides) are now generated at the gate structures 35 and 36, as well as, at the emitter and base terminal structures 37 and 38. The manufacture of the source/drain regions of the n-channel transistors B then proceeds and the n-doping of the emitter terminal 38 of the bipolar transistors A and of the gate electrode 35 is simultaneously carried out by phosphorus ion implantation given a dose level of $8 \times 20^{15}$ cm$^{-2}$ and an energy level of 80 keV following prior photoresist masking of the remaining regions, i.e., p-channel transistors and bipolar transistor region with the exception of the emitter contact area 38.

In a similar way to that set forth above, the source/drain areas 41 of the p-channel transistors C and, simultaneously, the p-doping of the base terminal 37 of the bipolar transistor A and of the gate electrode 36 are generated by boron ion implantation having a dose level of $4 \times 10^{15}$ cm$^{-2}$ and an energy level of 40 keV. The n-channel transistor region B and the emitter contact 38 of the bipolar transistor A are thereby covered with a photoresist mask. The spacing between the emitter and base terminals 37 and 38, respectively, is defined by the emitter spacer oxide 39. After the diffusion of the emitter and base terminal into the zones 42 and 43, the circuit arrangement is finished in a known manner by contact hole technique, metallization (single-layer or two-layer metallization), and passivation. The letters located under FIG. 12 illustrate the area of the bipolar transistor A and the regions of the n-channel transistor B as well as the p-channel transistor C.

In an embodiment of the method of the present invention, it is also possible to begin with a p-doped substrate 1 having a specific electrical resistance of 0.02 ohm/cm and to omit the implantation for producing the buried collector illustrated in FIG. 1. If a substrate having a specific electrical resistance of 20 ohms/cm is utilized, the implantation shown in FIG. 1 can be omitted and the epitaxial layer shown in FIG. 3 need not be applied. The process is simplified by eliminating the buried collector.

Figure 13:
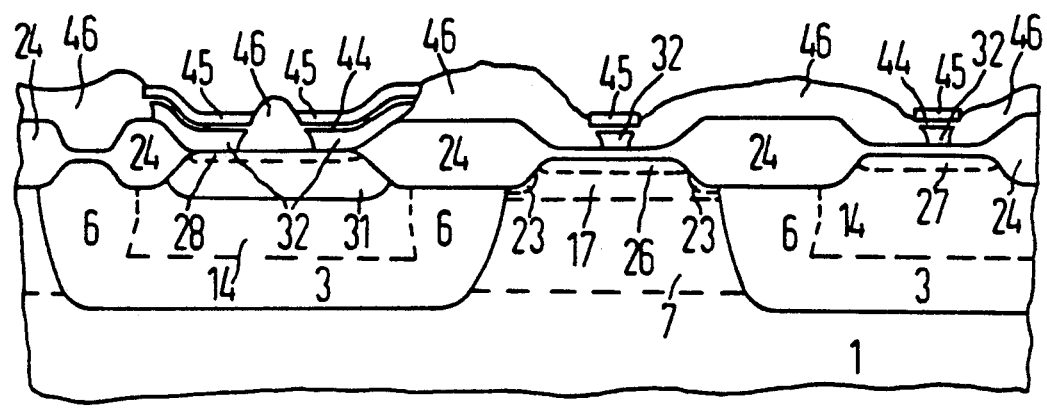
FIGS. 13 and 14 illustrate a further embodiment of the method for making the integrated circuit of the present invention.
Figure 14:
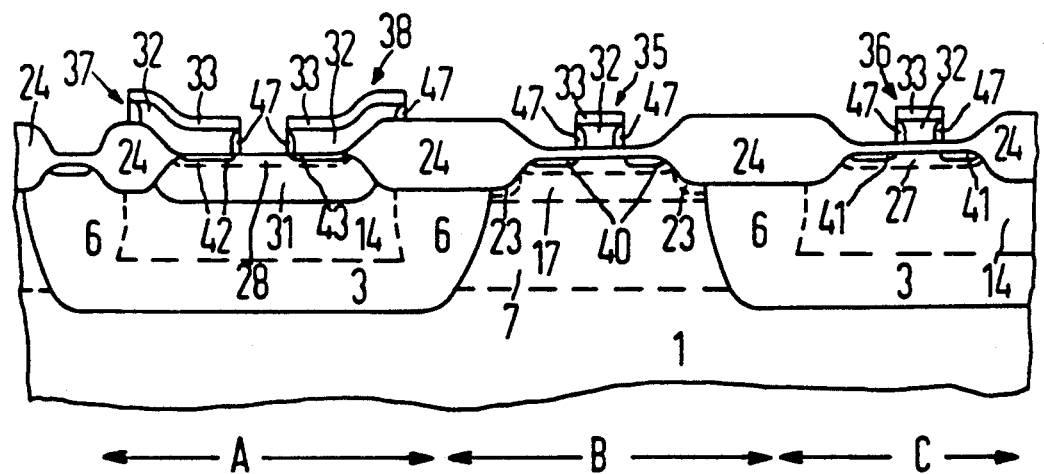

In another embodiment of the method of the present invention, the method steps illustrated in FIGS. 11 and 12 are modified. Instead of the structuring of the double layer 32 and 33 as set forth in FIG. 11 for the formation of the base and emitter terminals 37 and 38 and of the gate electrodes 35 and 36, a polysilicon layer is thereby applied. The polysilicon layer is locally oxidized and an anisetropic oxide etching is carried out for the generation of the spacer 47. An oxide spacer 47 thereby arises at the gates and the critical etching process of polysilicon on the monocrystalline silicon in the area of the bipolar transistor for separating the base and emitter terminals is eliminated. FIGS. 13 and 14 further illustrate the embodiment of the method of the present invention.

Referring now to FIG. 13, after all the process steps set forth and illustrated in FIGS. 1-10 of the first embodiment are carried out, the process illustrated in FIG. 13 is then performed. To this end, a polysilicon layer 32 and a double layer composed of silicon dioxide 44 and silicon nitride 45 are applied surface-wide. This three layer structure 32, 44, and 45 is structured by phototechnique and nitride etching in accord with the gate electrodes 35 and 36 and the emitter and base terminals 37 and 38. The oxide layer 46 arises by oxidation of the polysilicon.

Now referring to FIG. 14, an anistropic oxide etching of the silicon dioxide layer 46 for producing the spacer 47 now proceeds. This spacer comprises an inverted form in comparison to the spacer 39 in FIG. 12. The silicon nitride mask 45 is removed and a selective tantalum silicide deposition 33 onto the gates 35 and 36, the emitter terminal 38, and base terminal 37 is carried out. All further process steps are carried out as set forth in FIG. 12.

Figure 15:
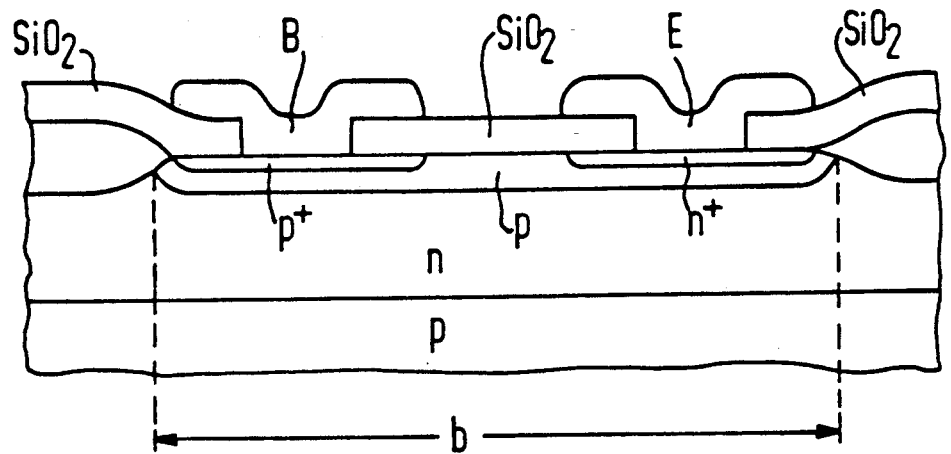
FIG. 15 illustrates a base emitter complex of a NPN transistor manufactured in accordance with a method known in the art.
Figure 16:
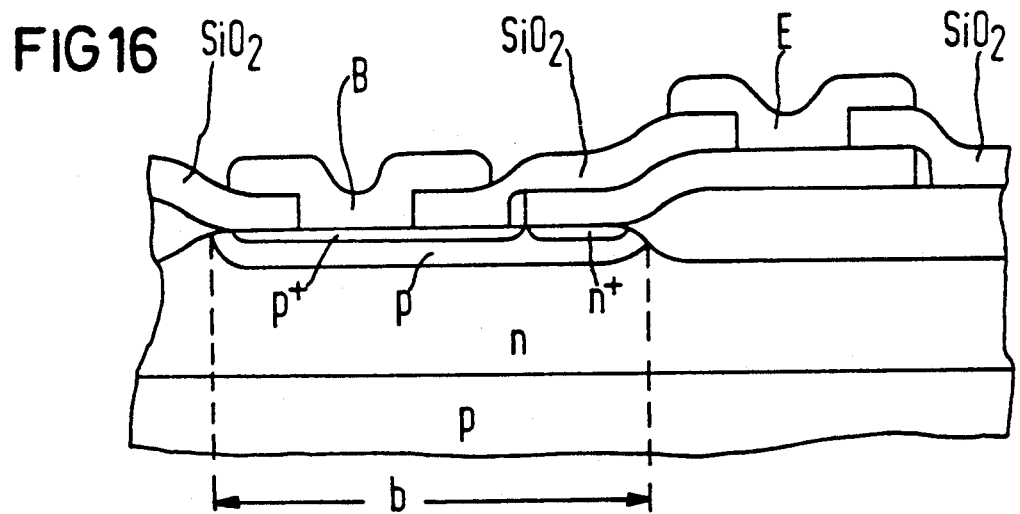
FIG. 16 illustrates a base emitter complex manufactured in accordance with the method disclosed in U.S. patent application, Ser. No. 897,299 (now abandoned).
Figure 17:
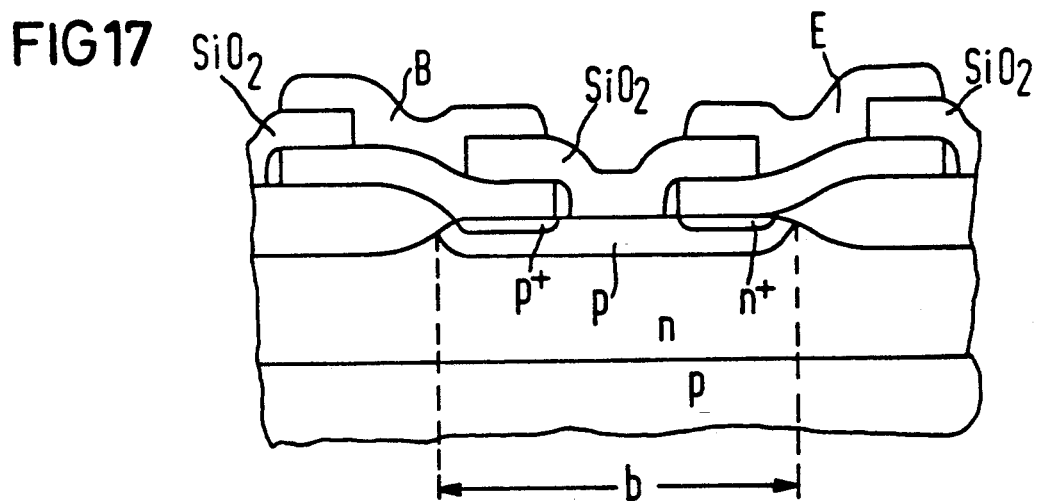
FIG. 17 illustrates a base emitter complex manufactured i accordance with the method of the present invention.

FIGS. 15-17 illustrate a relative size comparison of the base emitter complex of a traditional npn transistor, the transistor of U.S. patent application Ser. No. 897,299 (now abandoned), and a bipolar transistor manufactured in accordance with the method of the present invention. The minimum base width is illustrated by the letter "b". The various dopings have also been entered. The insulating oxide is provided with the symbol "SiO$_2$". The letters "B" and "E" denote base and emitter.

It should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for manufacturing an integrated semiconductor circuit containing bipolar and complementary MOS transistors comprising the steps of:
   a) providing a p-doped semiconductor substrate;
   b) manufacturing a buried n+ doped zone in the p-doped substrate by implanting n-doping ions following prior masking of the remaining areas;
   c) applying surface-wide a p-doped epitaxial layer;
   d) providing a surface-wide double insulating layer of silicon oxide and silicon nitride;
   e) defining the areas for the more deeply extending collector terminal by implanting with n-doping ions following prior structuring of the silicon nitride layer by photolithography;
   f) generating the n-wells in the substrate by implanting n-doping ions following stripping of the silicon nitride structures in the areas in which the n-wells are to be formed;

g) diffusing the n-doping ions into the substrate while simultaneously oxidizing the surface of the n-well areas;

h) implanting boron ions to form a surface-distal region of a channel zone of the n-channel transistor following the removal of the silicon nitride structures, whereby the oxide surface acts as a mask;

i) applying a double layer of silicon oxide and silicon nitride and corresponding structuring of the silicon nitride layer for the following local oxidation (LOCOS);

j) implanting boron ions for doping the field oxide areas of the n-channel transistors following prior photoresist masking of the remaining areas;

k) manufacturing the field oxide required for separating the active transistor areas in the substrate, by locally oxidizing the field oxide regions utilizing the previously deposited silicon nitride structure as an oxidation mask;

l) oxidizing the surface to generate the gate oxide following removal of the silicon nitride structures;

m) boron doping the channel areas of the n-channel and p-channel MOS transistor;

n) manufacture of a base zone in the bipolar transistor region by boron doping the base zone following prior photoresist masking of the remaining areas;

o) removing the gate oxide in the area of the base zone;

p) depositing at least a single layer of a metal silicide over the surface;

q) structuring the metal silicide layer for the manufacture of the gate electrodes of the MOS transistors as well as of the base and emitter contacts of the bipolar transistors;

r) generating a sidewall insulating layer by surface-wide oxide deposition from the vapor phase and anisotropic etching;

s) simultaneously forming the source/drain areas of the n-channel transistors, the n-doping of the collector and emitter contact of the bipolar transistors, and of the gate electrode of the n-channel transistors by phosphorus ion implantation following prior photoresist masking of the p-channel transistor areas and of the bipolar transistor areas with the exception of the n-emitter region and of the collector contact area;

t) simultaneously forming the source/drain areas of the p-channel transistors, the p-doping of the base contact of the bipolar transistors, and of the gate electrode of the p-channel transistors by boron ion implantation following prior photoresist masking of the n-channel transistor regions and of the bipolar transistor regions with the exception of the p-base area;

u) executing a high-temperature treatment for the diffusion of the base and emitter contacts;

v) depositing a surface-wide silicon oxide layer from the vapor phase, said layer acting as intermediate oxide; and w) exposing the contact hole regions, execution of the metallization for the manufacture of the terminal electrodes and passivation.

2. A method for manufacturing an integrated semiconductor circuit containing bipolar and complementary MOS transistors comprising the steps of:

a) providing a p-doped semiconductor substrate;

b) manufacturing a buried n+ doped zone in the p-doped substrate by implanting n-doping ions following prior masking of the remaining areas;

c) applying surface-wide a p-doped epitaxial layer;

d) providing a surface-wide double insulating layer of silicon oxide and silicon nitride;

e) defining the areas for the more deeply extending collector terminal by implanting with n-doping ions following prior structuring of the silicon nitride layer by photolithography;

f) generating the n-wells in the substrate by implanting n-doping ions following stripping of the silicon nitride structures in the areas in which the n-wells are to be formed;

g) diffusing the n-doping ions into the substrate while simultaneously oxidizing the surface of the n-well areas;

h) implanting boron ions to form a surface-distal region of a channel zone of the n-channel transistor following removal of the silicon nitride structures, whereby the oxide surface acts as a mask;

i) applying a double layer of silicon oxide and silicon nitride and corresponding structuring of the silicon nitride layer for the following local oxidation (LOCOS);

j) implanting boron ions for doping the field oxide areas of the n-channel transistors following prior photoresist masking of the remaining areas;

k) manufacturing the field oxide required for separating the active transistor areas in the substrate, by locally oxidizing the field oxide regions utilizing the previously deposited silicon nitride structure as an oxidation mask;

l) oxidizing the surface to generate the gate oxide following removal of the silicon nitride structures;

m) boron doping the channel areas of the n-channel and p-channel MOS transistor;

n) manufacture of a base zone in the bipolar transistor region by boron doping the base zone following prior photoresist masking of the remaining areas;

o) removing the gate oxide in the area of the base zone;

p) depositing a layer sequence comprising polysilicon, silicon dioxide, and silicon nitride;

q) structuring the silicon nitride layer for the manufacture of the gate electrodes, base and emitter contacts and oxidation of the polysilicon layer utilizing the nitride structure as a mask;

r) executing an anistropic oxide etching for generating the spacer oxides and selective silicide deposition onto the gate electrodes and onto the base and emitter contact;

s) simultaneously forming the source/drain areas of the n-channel transistors, the n-doping of the collector and emitter contact of the bipolar transistors, and of the gate electrode of the n-channel transistors by phosphorous ion implantation following prior photoresist masking of the p-channel transistor areas and of the bipolar transistor areas with the exception of the n-emitter area and of the collector contact area;

t) simultaneously forming the source/drain areas of the p-channel transistors, of the p-doping of the base contact of the bipolar transistors, and of the gate electrode of the p-channel transistors by boron ion implantation following prior photoresist masking of the n-channel transistor regions and of the bipolar transistor regions with the exception of the p-base area;

u) executing a high-temperature treatment for the diffusion of the base and emitter contacts;

v) depositing a surface-wide silicon oxide layer from the vapor phase, said layer acting as intermediate oxide; and w) exposing the contact hole regions, execution of the metallization for the manufacture of the terminal electrodes and passivation.

3. The method according to claim 1 including the step of implanting boron ions in the area of the n-channel MOS transistors between steps l) and m) following prior phototechnique.

4. The method according to claim 2 including the step of implanting boron ions in the region of the n-channel MOS transistor between steps l) and m) following prior phototechnique.

5. The method of claim 1 wherein step p) involves depositing a double layer of polysilicon and a metal silicide.

6. The method of claim 1 wherein the substrate is a p-doped, (100)-oriented silicon substrate having a specific electrical resistance of 20 ohms/cm is utilized.

7. The method of claim 2 wherein the substrate is a p-doped, (100)-oriented silicon substrate having a specific electrical resistance of 20 ohms/cm is utilized.

8. The method of claim 1 wherein the substrate is a p-doped, (100)-oriented silicon substrate having a specific electrical resistance of 0.02 ohms/cm is employed; and step b) eliminated.

9. The method of claim 2 wherein the substrate is a p-doped, (100)-oriented silicon substrate having a specific electrical resistance of 0.02 ohms/cm is employed; and step b) is eliminated.

10. The method of claim 1 wherein steps b) and c) are eliminated.

11. The method of claim 2 wherein steps b) and c) are eliminated.

12. The method of claim 1 wherein the specific electrical resistance of the p-doped expitaxial layer of step c) is set to 20 ohms/cm and the layer thickness is set to about 3 um.

13. The method of claim 2 wherein the specific electrical resistance of the p-doped expitaxial layer of step c) is set to 20 ohms/cm and the layer thickness is set to about 3 um.

14. The method of claim 1 wherein the manufacture of the sidewall insulation layer of method step r) proceeds by thermal decomposition of tetraethylorthosilicate.

15. The method of claim 2 wherein the manufacture of the sidewall insulation layer of method step r) proceeds by thermal decomposition of tetraethylorthosilicate.

16. A method for manufacturing an integrated circuit that contains at least one bipolar transistor, one n-channel transistor and one complementary p-channel transistor on a common substrate, the method comprising the steps of:

depositing, surface wide on the substrate, a layer that contains at least one silicide of a refractor metal;

after a corresponding masking, structuring the layer such that a base terminal and an emitter terminal with the bipolar transistor, a gate electrode for the n-channel transistor and a gate electrode for the p-channel transistor are created therefrom;

after a further masking, the source and drain regions as well as the gate electrode of the p-channel transistor and the base terminal of the bipolar transistor are covered by the masking, providing an ion implantation with n-doping, wherein the source and drain regions as well as the gate electrode for the n-channel transistor and the emitter terminal for the bipolar transistor are n-doped;

after a further masking, which masking is designed such that the source and drain region as well as the gate electrode of the n-channel transistor and the emitter terminal of the bipolar transistors are covered, providing an ion implantation with p-doping ions, whereby the source and drain regions as well as the gate electrode of the p-channel transistor and the base terminal for the bipolar transistor are p-doped.

17. The method of claim 16 wherein:

after structuring the layer, depositing surface-wide an insulating layer; and producing a spacer oxide from the insulating layer at the gate electrodes, the base contact and the emitter terminal by anistropic re-etching.

18. The method of claim 16 wherein the layer from which the base terminal, emitter contact, and gate electrodes are formed is a double layer.

19. The method of claim 16 wherein the layer from which the base terminal, emitter contact, and gate electrodes are formed is a double layer, the first layer being a polysilicon layer deposited in the substrate and a layer of a silicide of a refractory metal is deposited on the polysilicon layer.

* * * * *